(12) United States Patent  
Nishimura et al.

(10) Patent No.: US 7,274,050 B2
(45) Date of Patent: Sep. 25, 2007

(54) PACKAGING AND MANUFACTURING OF AN INTEGRATED CIRCUIT

(75) Inventors: Ken Nishimura, Fremont, CA (US); Qing Bai, Sunnyvale, CA (US); Tracy Bell Verhoeven, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 31 days.

(21) Appl. No.: 10/976,750

(22) Filed: Oct. 29, 2004

(65) Prior Publication Data

US 2006/0094206 A1    May 4, 2006

(51) Int. Cl.
 *H01L 23/58* (2006.01)
(52) U.S. Cl. .................. 257/212; 257/213; 257/288; 257/183; 257/E21; 257/51; 257/499
(58) Field of Classification Search ............. 257/288, 257/678, 277, 212, 213, 192, 197, 183
See application file for complete search history.

(56) References Cited

U.S. PATENT DOCUMENTS

| | | | |
|---|---|---|---|
| 4,631,400 A | 12/1986 | Tanner et al. | |
| 4,959,900 A | 10/1990 | De Givry et al. | |
| 5,682,064 A | 10/1997 | Atkins et al. | |
| 5,778,523 A | 7/1998 | Sylvester | |
| 6,090,687 A * | 7/2000 | Merchant et al. | 438/455 |
| 6,118,181 A * | 9/2000 | Merchant et al. | 257/757 |
| 6,258,626 B1 | 7/2001 | Wang et al. | |
| 6,462,620 B1 * | 10/2002 | Dupuis et al. | 330/264 |
| 6,693,698 B2 * | 2/2004 | Marshall et al. | 349/148 |
| 2006/0012021 A1 * | 1/2006 | Larson et al. | 257/686 |

OTHER PUBLICATIONS

Search report from corresponding U.S. Appl. No. PCT/US05/34824 dated Feb. 14, 2006.

* cited by examiner

*Primary Examiner*—David Nhu (57) ABSTRACT

Apparatus, packaging, and methods of manufacture of an integrated circuit are provided. The integrated circuit includes a component of a first type fabricated on a first substrate containing a first material, and a component of a second type fabricated on a second substrate containing a second material. The first material has better compatibility than the second material with fabrication and/or performance of the component of the first type, while the second material has better compatibility than the first material with fabrication and/or performance of the component of the second type. Also described, is a method of making the above-mentioned integrated circuit, the method including, among other steps, the step of disposing the first and second substrates opposite one another, and the step of establishing an electrical connection between the components.

14 Claims, 7 Drawing Sheets

PACKAGING AND MANUFACTURING OF AN INTEGRATED CIRCUIT

DESCRIPTION OF THE RELATED ART

An integrated circuit (IC) typically incorporates a substrate upon which is fabricated an electronic circuit comprising various components such as transistors, resistors, capacitors, and inductors. The selection of the substrate material is influenced by a number of factors related to the design and manufacture of the IC. Some of these factors, such as device cost, device packaging density, and device performance, tend to be interdependent, sometimes in an adverse manner. Consequently, trade-offs have to be made in the selection of the substrate based on certain priorities related to these factors.

One such trade-off relates to accepting sub-optimal device performance in the interests of maximizing packaging density. Typically, such a maximizing of packaging density entails fabricating most or all of the components on a commonly-shared substrate even if the performance of some components of the circuit is compromised when these components are fabricated on the selected substrate. One example of compromised performance pertains to parasitic capacitance that is introduced into the electronic circuit when a component is fabricated on the selected substrate. Although the effect of parasitic capacitance can be countered to some degree by accommodating for this capacitance in the design of the electronic circuit, the signal loss associated with this capacitance, especially upon higher frequency signals, can have a significant negative impact upon circuit performance. A second example of compromised performance pertains to manufacturing issues that can arise when a component such as, for example, a transistor that provides optimal performance when fabricated on a particular substrate, is alternatively fabricated on a second substrate that has been selected based on other factors such as device cost.

While several alternative packaging techniques have been proposed to overcome some of the handicaps mentioned above, such alternative approaches are often burdened by increased manufacturing cost and awkward handling procedures. Attention is drawn to U.S. Pat. No. 6,462,620 B1 (RF power amplifier circuitry and method for amplifying signals) as one example of such an alternative packaging technique.

It can therefore be appreciated that in light of the above-mentioned shortcomings in the existing art, there exist a need for improvements in the fabrication and performance characteristics of integrated circuits.

SUMMARY OF THE DISCLOSURE

Generally, embodiments of the present disclosure pertain to an integrated circuit having a first substrate on which is fabricated a component of a first type, and a second substrate on which is fabricated a component of a second type. A material contained in the first substrate is better compatible in one or more aspects, with the component of the first type than a material contained in the second substrate. The material contained in the second substrate is better compatible in one or more aspects, with the component of the second type than the material contained in the first substrate.

In one of several exemplary embodiments, a method of making an integrated circuit includes fabricating a component of a first type on a first substrate containing a first material that is more compatible with the component of the first type than a material contained in a second substrate upon which is fabricated a component of a second type. The material of the second substrate is more compatible with the component of the second type than the material contained in the first substrate. The method further includes establishing an electrical connection between the components.

Clearly, some embodiments of the disclosure may exhibit advantages in addition to, or in lieu of, those mentioned above. Additionally, other packaging and methods of manufacture may become apparent. It is intended that all such additional systems, methods, features and/or advantages be included within the scope of the disclosure.

BRIEF DESCRIPTION OF THE DRAWINGS

Many aspects of the invention can be better understood with reference to the following drawings. The components in the drawings are not necessarily to scale, emphasis being placed instead on clearly illustrating the invention. Moreover, in the drawings, like reference numerals designate corresponding parts throughout the several views.

DETAILED DESCRIPTION

The various embodiments describe some aspects of improving the fabrication and performance characteristics of an integrated circuit. In one of several exemplary embodiments, an integrated circuit (IC) is fabricated to include a first and a second substrate. The first substrate contains material that provides better compatibility in various aspects, such as for example, fabrication and performance, with a certain type of component that is fabricated on this substrate rather than on the second substrate that contains a different material. The material contained in the second substrate is better suited to a second type of component that is fabricated on this second substrate. Both the components are a part of an electronic circuit, and are electrically connected to one another through one or more electrically-conductive interconnections between the first and second substrates.

In this manner, the selection of the two substrates as well as the interconnect technologies used on the components fabricated on these substrates can be carried out independently, consequently optimizing the overall performance of the electronic circuit that is contained in the integrated circuit. While this exemplary embodiment describes the use of two substrates, in other embodiments, more than two substrates may be used. The exemplary embodiment outlined above, as well as other exemplary embodiments, will now be explained in further detail using the figures listed above.

Figure 1:
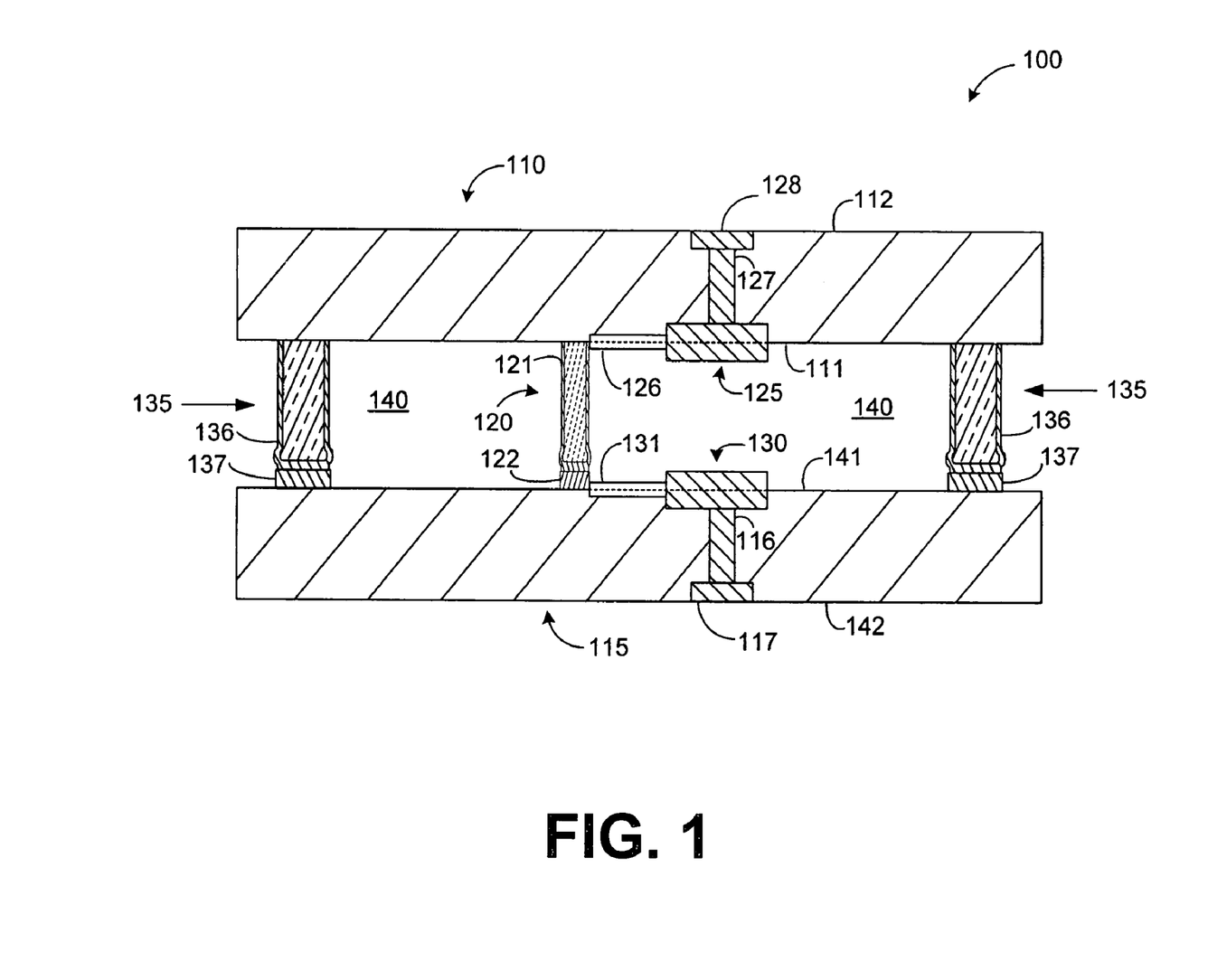
FIG. 1 is a cross-sectional view of an integrated circuit fabricated in accordance with one exemplary embodiment of the present disclosure.

FIG. 1 is a cross-sectional view of an integrated circuit 100 fabricated in accordance with a first exemplary embodiment. Substrate 110, which will be hereafter referred to alternatively as a "lid substrate," is one of two substrates that are a part of integrated circuit 100. Substrate 115, which will be hereafter referred to alternatively as a "base substrate," is a second substrate that is also a part of integrated circuit 100. It will be understood that the terms "lid" and "base" are used merely for convenience of explanation.

In FIG. 1, circuit component 125 is fabricated on a surface 111 of substrate 110, while circuit component 130 is shown fabricated on a surface 141 of substrate 115. An electrically-conductive interconnection in the form of electrically-conductive post 120 extends between the two substrates. In this exemplary embodiment, electrically-conductive post 120 is composed of, for example, a compliant material such as a polyimide or a compliant polymer. Polymers are generally poor electrical conductors. Therefore, at least a portion of the conductive post 120 is coated with a layer 121 of an electrically conductive material. Conductive post 120 is formed on lid substrate 110 before the two substrates 110 and 115 are bonded together. Alternatively, post 120 can be formed on base substrate 115. When bonded, conductive post 120 makes electrical contact with an electrically conductive pad 122 located on base substrate 115. The conductive pad 122 helps form an electrical connection by providing a relatively wide, electrically conductive region to make electrical contact with conductive post 120 when the circuit 100 is assembled. In FIG. 1, the conductive pad 122 is shown located external to the surface 141 of substrate 115. In alternative embodiments, conductive pad 122 may be fabricated partially or wholly above surface 141.

Circuit component 125 is connected to conductive post 120 through an electrically-conductive trace 126 fabricated on surface 111 of substrate 110. In alternative embodiments, conductive trace 126 is fabricated on one or more metallization layers that are located above the surface 111 of substrate 110.

Circuit component 130 is connected to conductive pad 122 through an electrically-conductive trace 131 located on surface 141 of substrate 115. Conductive pad 122 is electrically connected to conductive post 120 as described above. Consequently, an electrical interconnection exists between circuit components 125 and 130 via conductive trace 126, conductive post 120, conductive pad 122, and conductive trace 131.

A gasket 135 extends around the periphery of integrated circuit 100, and provides a hermetic seal for a chamber 140 additionally bounded by substrates 110 and 115. As used herein, a gasket that provides a hermetic seal for a chamber will be referred to as a "hermetic gasket." Various configurations of the gasket 135 may be used in various embodiments. For example, commonly-assigned U.S. Pat. Nos. 6,090,687 and 6,118,181, which are both incorporated herein by reference, describe techniques that may be used to form a gasket providing a hermetic seal. In the exemplary embodiment illustrated in FIG. 1, the gasket 135 is composed of a compliant material, such as a polyimide or a compliant polymer. However, polymers are non-hermetic and have not been typically used to form hermetic seals. Consequently, at least a portion of the gasket 135 is coated with a layer 136 of a sealing material, such as gold, copper, glass, or silicon nitride. Coating the polymer with the sealing material enables the gasket 135 to form a hermetic seal. The gasket 135 can be of any desired shape (e.g., circle, square, rectangle, etc.). If desired, a pad 137 similar in shape to gasket 135 may be formed on the base substrate 115 to make contact with the gasket 135 when the integrated circuit 100 is assembled.

Circuit component 125 is shown connected to an external electrically-conductive pad 128 by means of a via 127 that extends through the substrate 110 between surface 111 and surface 112. Pad 128 may be used to connect integrated circuit 100 to other devices that are not shown in FIG. 1. Similarly, circuit component 130 is connected to an external electrically-conductive pad 117 by a via 116 that extends through the substrate 115 between surface 141 and surface 142. Pad 117 may be used to connect integrated circuit 100 to other devices that are not shown in FIG. 1.

It will be understood that in other alternative embodiments, external electrical connections can be provided by alternative embodiments of pads 117 and 128. Pad 117 may, for example, in a first alternative embodiment, be replaced by an electrically-conductive pin, while in a second alternative embodiment, one of the two pads 117 and 128 may be eliminated. Also, in an alternative embodiment, conductive post 120 is replaced by an electrically-conductive wire, such as a gold wire that is appropriately bonded, for example, ultra-sonically, between terminals of circuit components 125 and 130. In yet another alternative embodiment, electrically-conductive post 120 is formed on base substrate 115.

Figure 2:
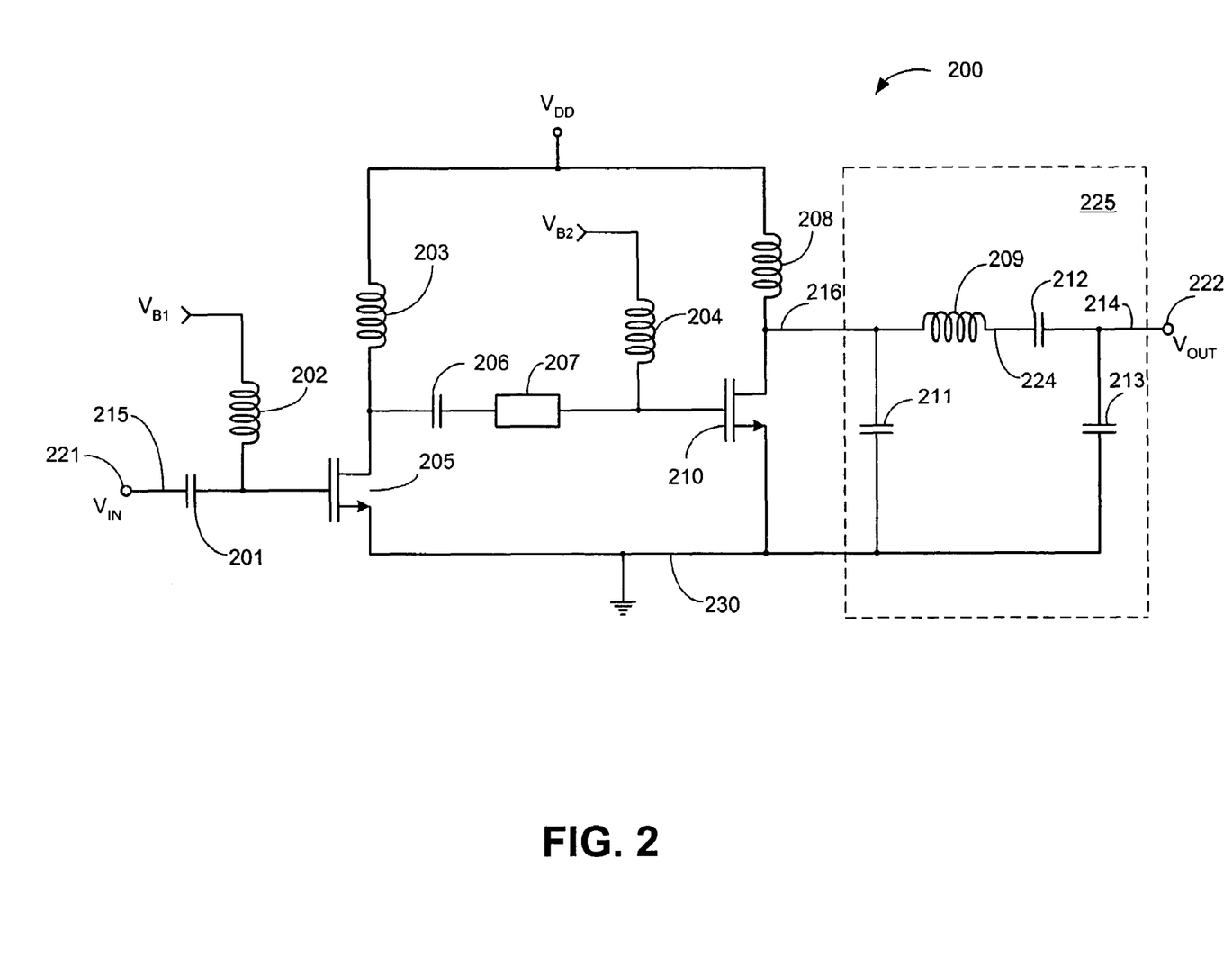
FIG. 2 is an exemplary circuit diagram—a radio-frequency (RF) amplifier, that incorporates active and passive components.

Attention is now drawn to FIG. 2, which shows an exemplary circuit that may be fabricated on two or more substrates, such as, for example, substrates 110 and 115 of FIG. 1. The exemplary circuit diagram depicts a known two-stage radio-frequency (RF) amplifier 200. In the interests of brevity, the circuit operation of RF amplifier 200 will not be elaborated in minute detail. On the other hand, certain aspects of the circuit that are pertinent to this disclosure will be elaborated below in more detail.

RF amplifier 200 comprises a number of components that can be broadly classified under two main categories namely, "active components" and "passive components." A few examples of active components are transistors and diodes, while some examples of passive components are resistors, capacitors, inductors, transmission line circuits, and transformers. Among the active components, there are various types of components fabricated using various types of materials and technologies. For example, among transistors, there are several types of transistors such as, a bipolar transistor, a unijunction transistor (UJT), and a field effect transistor (FET). These transistors are manufactured using various types of materials such as silicon, germanium, gallium arsenide, and indium phosphide, incorporating various technologies such as those used for fabricating monolithic-bipolar, complementary-bipolar, junction-gate FET (JFET), and insulated-gate FET (IGFET) devices.

Among bipolar transistors, the npn transistor is widely used in bipolar ICs. The choice of the npn transistor structure and the impurity profile of a selected substrate serves as a starting point for fabricating the bipolar IC. Passive as well as additional active components are then fabricated on this selected substrate taking into consideration the limitations of the material properties of the selected substrate. Unfortunately, if an additional active component, such as a JFET or an IGFET for example, or a passive component such as a capacitor, has to be fabricated on this same substrate, some accommodations have to be made due to the characteristics of the substrate material.

Figure 3:
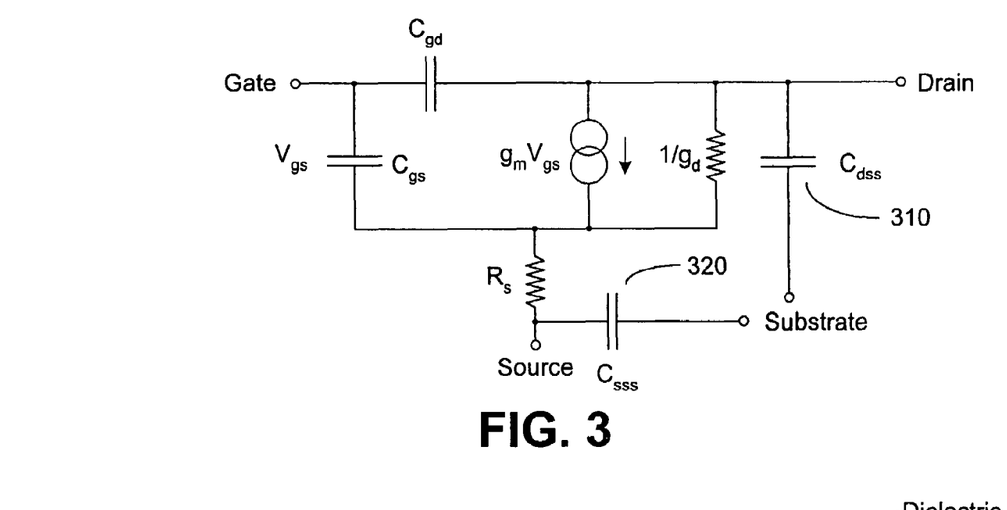
FIG. 3 illustrates an ac equivalent circuit of a JFET that is used in one embodiment of the RF amplifier of FIG. 2.

Addressing certain parameters associated with active components, attention is drawn to FIG. 3, which shows an ac equivalent circuit of a JFET operating in the pinched region. In one embodiment, transistor 205 in RF amplifier 200 of FIG. 2 is such a JFET. The ac equivalent circuit provides an approximation that can be used to define a frequency response of the JFET. $R_s$ represents the parasitic bulk resistance in series with the source contact, $C_{gs}$ and $C_{gd}$ are the gate-source and gate-drain capacitances, and $g_d$ is the dynamic output conductance due to channel-length modulation effects. In one typical layout, the drain area is made as small as possible to minimize the $C_{gd}$, because this capacitance provides parasitic coupling between the drain and the gate terminals and reduces the frequency capability of the JFET. $C_{dss}$ 310 is a parasitic capacitance present between the drain and the substrate, while $C_{sss}$ 320 is a parasitic capacitance present between the source and the substrate. These parasitic capacitances that are defined in large part by the material of the substrate, contribute to a significant degradation of device performance by reducing signal amplitude, especially at higher frequencies.

Figure 4A:
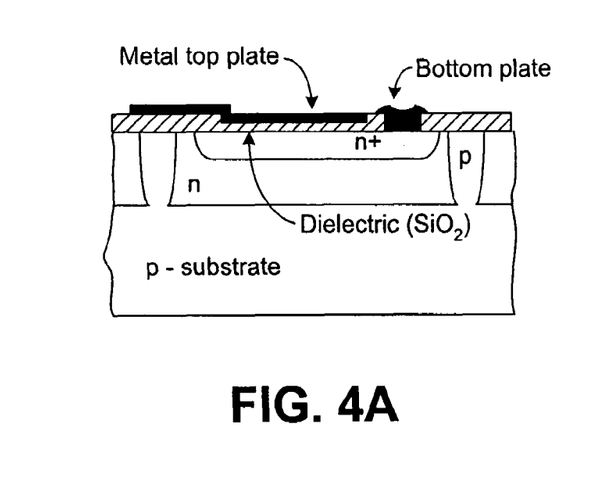
FIG. 4A illustrates the structure of a metal-oxide semiconductor (MOS) capacitor that is used in an embodiment of the RF amplifier of FIG. 2.
Figure 4B:
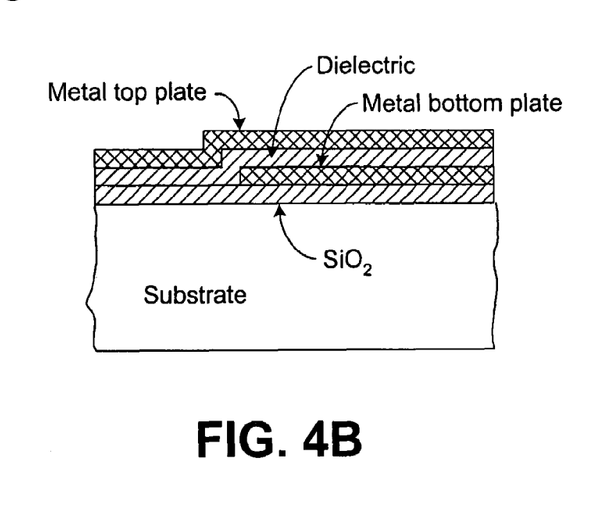
FIG. 4B illustrates the structure of a thin-film capacitor that is used in an embodiment of the RF amplifier of FIG. 2.

Turning to passive components, a thin-film capacitor, such as one that is used in an exemplary embodiment, for capacitor 212 of FIG. 2, is typically composed of two conductive layers separated by a dielectric. The thin-film capacitor can be fabricated using a metal-oxide semiconductor (MOS) structure as shown in FIG. 4A, or alternatively, by using a thin dielectric film between two conducting metal layers as shown in FIG. 4B. The MOS structure is commonly used in monolithic circuits because it is readily compatible with conventional processing technology and does not require multiple metallization layers.

A capacitor, whether thin-film or MOS, suffers from handicaps in terms of undesirable signal-loss associated with parasitic capacitances present between parts of the capacitor and the substrate upon which the capacitor is fabricated. The parasitic capacitance constitutes one component of the effective impedance presented by the capacitor. When this effective impedance is compared to the impedance presented by the substrate, signal-loss is maximized when the effective impedance of the capacitor is a conjugate match to the impedance of the substrate. Therefore, the signal-loss can be reduced by intentionally introducing an impedance mismatch between capacitor and substrate. Such an impedance mismatch can be introduced by using a substrate that has a relatively high resistivity or is an ideal conductor. Examples of semiconductor substrate materials having high resistivity are gallium arsenide (GaAs) and indium phosphide (InP). These materials can be used to produce high quality passive components. However, in many cases, substrates selected for fabricating active components present a sub-optimal impedance characteristic that is close to the impedance presented by a typical capacitor fabricated upon this substrate. Consequently, a capacitor fabricated on such a "lossy" substrate provides an undesirable signal-loss.

Apart from the above-mentioned characteristics of a capacitor, another passive component, an inductor, such as inductor 209 of FIG. 2, also suffers from signal-loss created due to the presence of parasitic capacitance contributed by the substrate upon which the inductor is mounted. In addition to the negative effects of parasitic capacitance, inductor performance is further compromised by the presence of eddy currents that flow in the substrate as a result of a magnetic field present around the inductor. Eddy currents and parasitic capacitance can be minimized by an appropriate selection of substrate material. The material is selected to minimize these undesirable effects rather than compromise by fabricating the inductor on a substrate that has been selected with an active component in mind.

While various undesirable effects have been elaborated above, the fabrication and performance of various components on a substrate is further influenced by additional factors such as poor temperature coefficient, poor absolute value tolerances, and limited power handling capacity of the material of the substrate.

Attention is now drawn once again to the RF amplifier 200 shown in FIG. 2. RF amplifier 200 is partitioned into two sections, one section containing active components (transistors 205, 210), and a second section, network 225, that has passive components only. As explained above, when fabricated upon a substrate, the active components incorporate certain lossy, parasitic capacitances as well as undesirable resistances. Consequently, in a first embodiment, a first substrate containing a first material is selected for fabricating the active components only. As one example, this first material is silicon with a bulk resistivity less than 100 ohm-cm. A second substrate containing a material that is different from that contained in the first substrate, is then selected for fabrication of the passive components of network 225. The bulk resistivity of this second material is, for example, greater than or equal to 1 kohm-cm. In general, substrates with higher resistivity have less loss than substrates with lower resistivity.

In a second embodiment, the first substrate is used to fabricate not only the active components (e.g. transistors 205 and 210) but also other components (e.g. inductor 203, capacitor 206, transmission line 207) shown outside the network 225. Similarly, the second substrate may also contain active devices that are not shown in FIG. 2. These alternative embodiments are implemented to cater to various goals, such as for example, device performance, device packaging density, number of layers in the substrates, and ease of manufacture.

It will be understood from the above example, that an integrated circuit can use two substrates having two different materials, depending upon the desired performance of components that are fabricated upon each of these substrates. Additionally, the components fabricated on a first of the two substrates may be interconnected to one another using a first interconnect technology. For example, when network 225, which operates as an impedance matching network, is fabricated on the first substrate, the electrical connections may be composed of metal traces that are specifically dimensioned to provide a desired characteristic impedance. Persons of ordinary skill in the art will understand that such a characteristic impedance is determined in part by the width of the metal trace together with the dielectric constant of the substrate. Also, space permitting, signal-loss is reduced in certain cases, for example when interconnecting the passive components of network 225, by the use of wider metal traces.

On the other hand, the interconnect technology employed to interconnect, for example, the two amplifier stages of RF amplifier 200, may be geared towards minimizing interconnect distance and size, rather than trace width. This may translate into the use of multiple metallization layers, which is undesirable from a cost point of view, because each additional metallization layer adds to fabrication cost as well as product cost.

The aspects mentioned above, can be summarized in one exemplary embodiment, wherein certain components, for example, all the active devices of FIG. 2, are fabricated upon a first substrate of a certain type of material. This first substrate is selected based on one or more factors such as, for example, compatibility for fabrication of the active components on the substrate, performance of these components when fabricated on this substrate, cost of materials, and cost of fabrication. A second substrate of another type of material is then selected for fabricating a second set of components. The second set of components, for example, all the passive devices of FIG. 2, are more compatible with the second substrate than the first substrate. Again, the second substrate is selected based upon one or more factors such as fabrication, performance, and cost. In this exemplary embodiment, fabricating all the passive components upon the second substrate, rather than upon the first substrate, allows independent selection of a second substrate that is lower in material cost, provides better circuit performance for passive devices, and furthermore, incorporates fewer metallization layers leading to lower material as well as fabrication costs.

In another embodiment, the first substrate is selected of a material having a first coefficient of thermal expansion (CTE), and the second substrate is selected of a material that has a compatible CTE to the CTE of the first substrate. An IC fabricated of these two substrates provides certain mechanical as well as electrical advantages.

Figure 5:
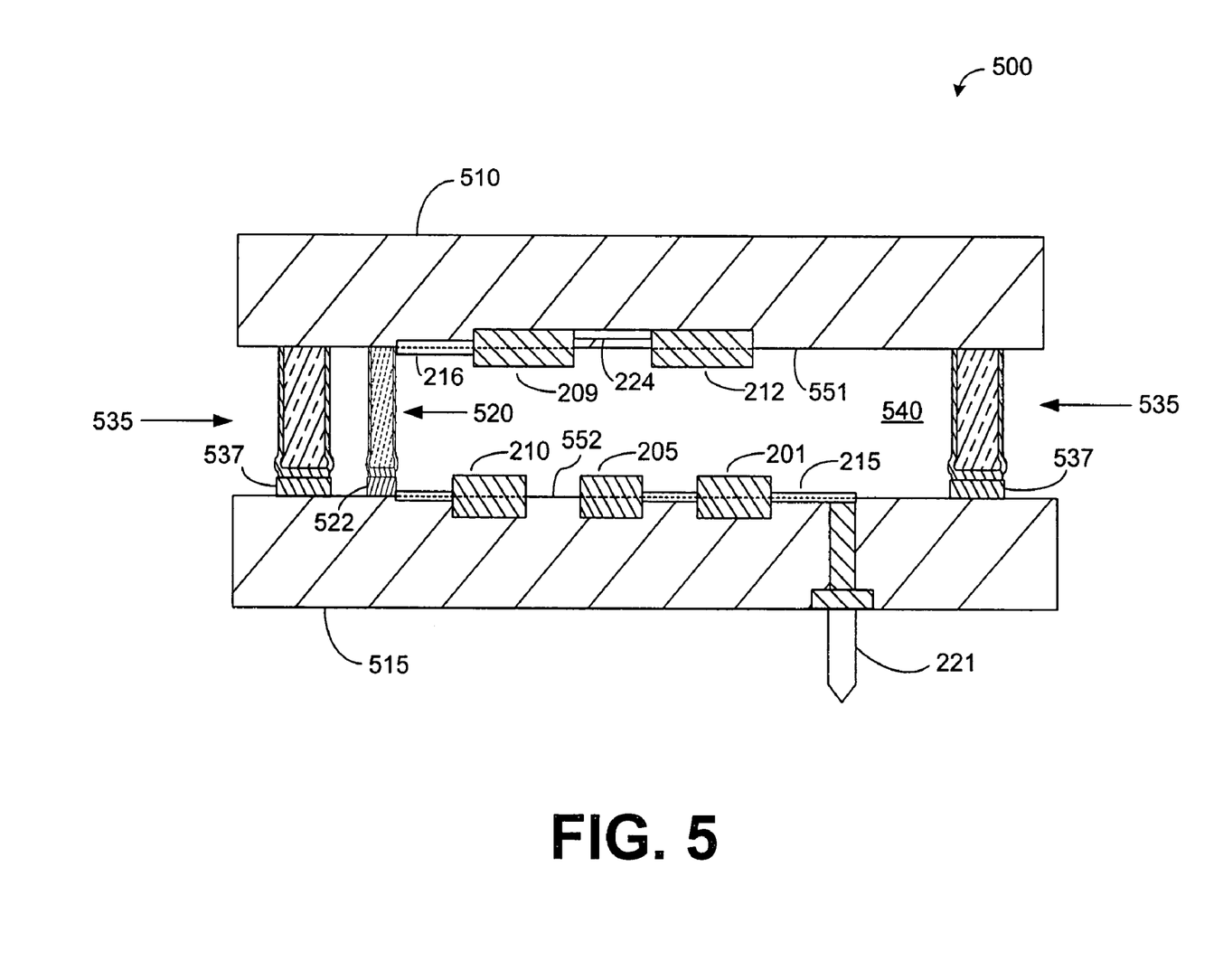
FIG. 5 is a cross-sectional view of an integrated circuit containing the components of FIG. 2, fabricated in accordance with a second exemplary embodiment.

FIG. 5 is a cross-sectional view of an integrated circuit 500 fabricated in accordance with one exemplary embodiment. The integrated circuit 500 of FIG. 5 incorporates the components of FIG. 2, some of which are shown for purposes of explanation. Substrate 510 comprises a high-resistivity material so as to provide certain desired characteristics when used in conjunction with network 225 (refer FIG. 2) that has passive components. One example of such a desired property, relates to low parasitic capacitance to reduce signal transmission loss.

Two of the passive components, inductor 209 and capacitor 212 are shown fabricated on surface 551 of substrate 510 facing substrate 515. Inductor 209 and capacitor 212 are electrically interconnected to each other via a metal trace 224. Metal trace 224 is dimensioned to provide a desired characteristic impedance in conjunction with the dielectric constant of substrate 510. Inductor 209 is further connected by metal trace 216 to electrically conductive post 520.

The second substrate of integrated circuit 500 is substrate 515 of a material that has lower resistivity than that of the material contained in substrate 510. Three components of FIG. 2, capacitor 201 and transistors 205 and 210, are shown fabricated on surface 552 of substrate 515. Capacitor 201, which operates as an input coupling capacitor in the circuit of FIG. 2, is connected by a metal trace 215 to input terminal 221. Input terminal 221 is a metal pin extending below substrate 515, and is used to mount integrated circuit 500 on a printed circuit board (PCB) (not shown) for example, and provide a means to electrically connect the circuit of integrated circuit 500 to other devices that may also be mounted on the same PCB. Persons of ordinary skill in the art will understand that there are several alternative embodiments of input terminal 221, including for example, surface mount pads and surface mount leads.

Electrically conductive post 520 and gasket 535 are embodiments of electrically conductive post 120 and gasket 135 of FIG. 1. It will be understood that electrically conductive post 520 and gasket 535 can be implemented in several alternative ways. Commonly assigned U.S. patent application Ser. No. 10/890343, entitled "A Film Bulk Acoustic Resonator Package and Method of Fabricating same," filed on Jul. 13, 2004, which is incorporated herein by reference, describes exemplary techniques that may be used to form the electrically conductive post 520, gasket 535, and a method of fabricating a device such as integrated circuit 500.

Also, if desired, a pad 537 similar in shape to gasket 535 may be located on the surface 552 of substrate 315 to make contact with the gasket 535 when the integrated circuit 500 is assembled. Similarly, an electrically conductive pad 522 for contacting the conductive post 520 may also be formed on surface 552 of substrate 515.

Figure 6:
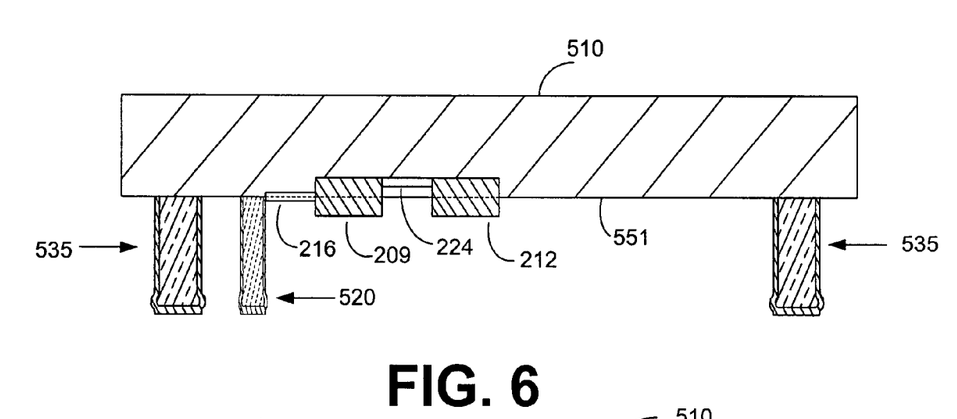
FIG. 6 is a cross-sectional view of an exemplary embodiment that includes a lid substrate, a compliant connection, and a compliant gasket that are parts of the integrated circuit of FIG. 5.
Figure 7:
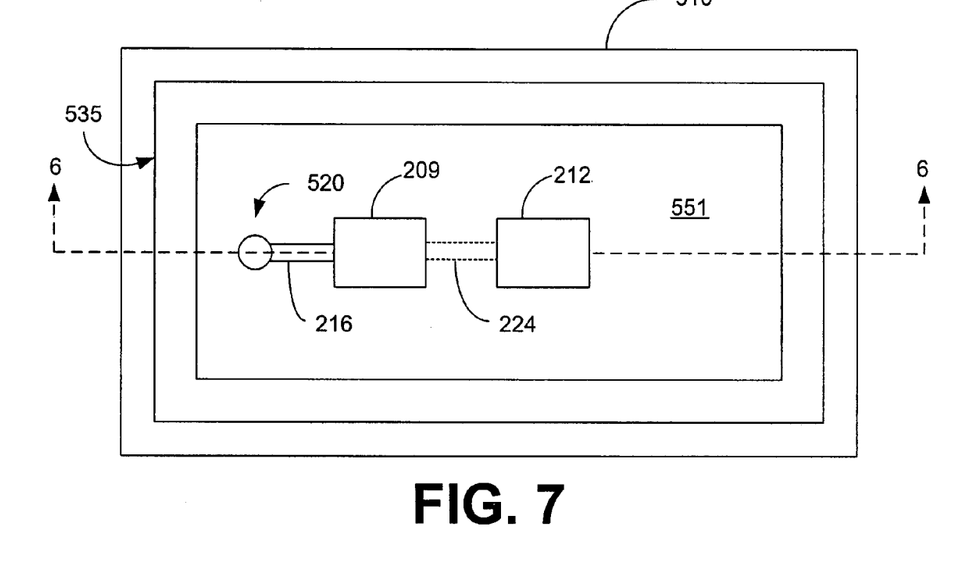
FIG. 7 is a bottom view of the lid substrate of FIG. 6.

Attention is now drawn to FIG. 6, which shows a cross-sectional view of substrate 510, together with electrically conductive post 520, gasket 535, and components fabricated on substrate 510. The cross-sectional view provides some information on the nature of the fabrication of one section, the lid section, of integrated circuit 500. FIG. 7 is a view of surface 551 of substrate 510 and other associated parts identified in FIG. 6. Attention is drawn to gasket 535 which is formed along the periphery of integrated circuit 500 and encloses the components inside a chamber that is formed when the substrate 510 is bonded to the base substrate.

Figure 8:
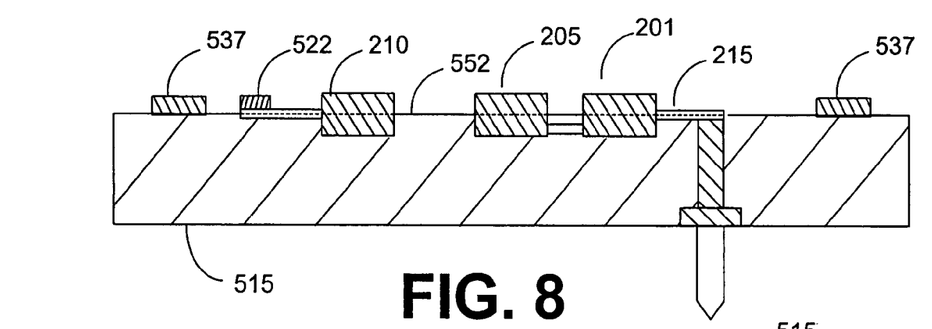
FIG. 8 is a cross-sectional view of an exemplary embodiment that includes a base substrate, and an external connection that are parts of the integrated circuit of FIG. 5.
Figure 9:
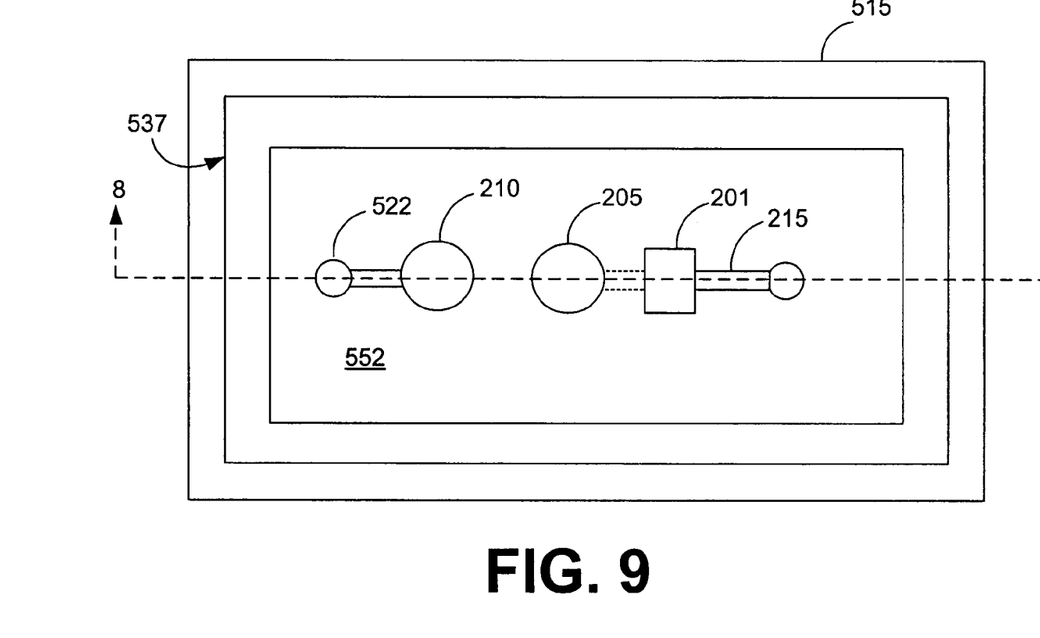
FIG. 9 is a bottom view of the base substrate depicted in FIG. 8.

FIG. 8 is a cross-sectional view of substrate 515, together with pad 537, electrically conductive pad 522, and components assembled on substrate 515. The cross-sectional view provides some information on the nature of the fabrication of the second section, the base section, of integrated circuit 500. FIG. 9 is a view of surface 552 of substrate 515 and other associated parts identified in FIG. 8. Attention is drawn to pad 537 which is formed along the periphery of integrated circuit 500 and mates with the gasket 535 shown in FIGS. 4 and 5. Also shown is electrically-conductive pad 522 which makes mechanical and electrical contact with the corresponding electrically-conductive post 520 shown in FIGS. 6 and 7.

Figure 10:
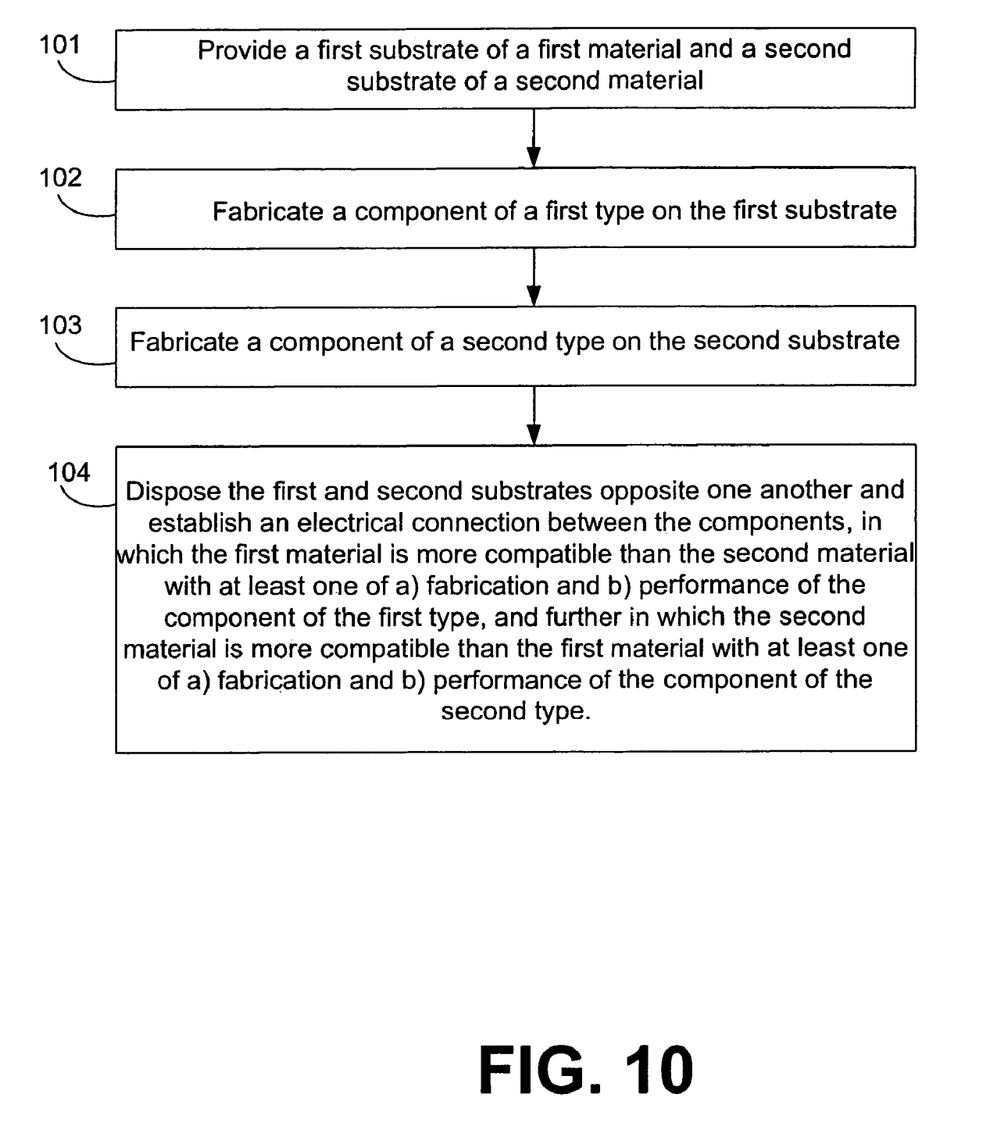
FIG. 10 is a flow chart illustrating one exemplary method of fabricating the integrated circuit of FIG. 5.

FIG. 10 is a flow chart illustrating one exemplary method of fabricating an integrated circuit such as integrated circuit 500. Merely for the sake of convenience, the exemplary embodiment illustrated in FIG. 5 (and other related figures) will be used to explain the flow chart of FIG. 10. It will be understood that, although particular example process steps are described below, alternative implementations are feasible. Moreover, steps may be executed out of order from that shown or discussed, including substantially concurrently or in reverse order.

In block 101, a first and a second substrate 510 and 515 of a first and second material respectively, are provided. In block 102, a component of a first type, such as for example, inductor 209, is fabricated on substrate 510. In block 103, a component of a second type, such as for example, transistor 205, is fabricated on substrate 515. In block 104, the first substrate 510 is disposed opposite the second substrate 515. For example, this disposition is carried out by pressing substrate 510 against, and bonding to, substrate 515. Specifically, substrate 510 is pressed against substrate 515, with conductive post 520 in contact with conductive pad 522, and gasket 535 in contact with pad 537. The compliant material of the conductive post 520 enables the post to deform without fracturing or otherwise failing as the two substrates are pressed together. Further, the compliant material of the gasket 535 enables the gasket 535 to deform without fracturing or otherwise failing as the substrates 510 and 515 are pressed together. The substrates 510 and 515 may be bonded while being pressed together. Various known or future-developed bonding techniques may be used to bond substrates 510 and 515, such as thermal compression bonding or solder bonding.

In one embodiment, the electrically-conductive material used to coat the conductive post 520 and gasket 535 is gold (Au). In such an embodiment, before the substrates 510 and 515 are bonded using solder bonding, a layer of tin (Sn) is deposited on the gold-coated conductive post 520 and gasket 535. Then, to bond the substrates 510 and 515 using solder bonding, the substrates 510 and 515 are pressed together until the conductive post 520 and gasket 535 make intimate contact with the substrate 515, and integrated circuit 500 is heated until the gold and tin material on the conductive post 520 and gasket 535 begins to melt, causing this material to diffuse and adhere to the substrate 515. Heating of the integrated circuit 500 is then stopped and the substrates 510 and 515 are allowed to cool. The melted gold and tin material hardens as the integrated circuit 500 cools, and the hardened material forms a bond between the substrate 515 and the conductive post 520, as well as gasket 535. The introduction of tin to the gold-coated conductive post 520 and gasket 535, as described above, helps to form a stronger bond during the solder bonding.

The compliant materials of the conductive post 520 and the gasket 535 help ensure that the conductive post 520 and gasket 535 intimately contact the substrate 515. In this regard, the compliant materials of the conductive post 520 and the gasket 535 allow the conductive post 520 and the gasket 535 to deform until the conductive post 520 and the entire periphery of the gasket 535 come into contact with the substrate 515. As an example, imperfections in the fabrication of conductive post 520 and the gasket 535 may cause the gasket 535 to contact pad 537 before conductive post 520 contacts pad 522. In such a situation, the gasket 535 deforms to allow the substrates 510 and 515 to be further pressed together until the conductive post 520 makes intimate contact with pad 522. Similarly, the conductive post 520 or portions of the gasket 535 may deform to allow the entire periphery of the gasket 535 to make intimate contact with pad 537. Ensuring intimate contact between the conductive post 520 and the pad 522 and between the gasket 535 and the pad 537 during bonding helps to ensure that the conductive post 520 provides a reliable, low-impedance electrical conduction between the substrates 510 and 515 and that the gasket 535 provides a reliable hermetic seal for the chamber 540.

After assembly of integrated circuit 500, the substrate 515 may be thinned, if desired, to reduce its thickness and provide better heat dissipation for the components mounted on this substrate. Any suitable fabrication technique for thinning the substrate 515, such as back-lapping or polishing, for example, may be used to thin the substrate 515. In one embodiment, the substrate 510 provides sufficient structural support so that the substrate 515 can be thinned with less concern for breakage or mechanical integrity.

It is unnecessary for either or both of the conductive post 520 and the gasket 535 to be formed on the same substrate 510. Either or both of the conductive post 520 and the gasket 535 may be alternatively formed on the substrate 515. In this case, pads similar to pads 537 and 522 are formed on substrate 510. The conductive post 520 and/or gasket 535 is then pressed against the pads located on substrate 510 during bonding.

In one exemplary embodiment, the gasket 535 is coated with a material, such as gold or copper, that not only seals the gasket 535 but is also electrically conductive. In such an embodiment, the gasket 535 provides an electrical connection between the substrates 510 and 515. If desired, the gasket 535 in addition to or instead of the conductive post 520 may provide the electrical connection between the circuit components fabricated on the two substrates. In such an embodiment, formation of the conductive post 520 may be unnecessary.

Attention is drawn to FIG. 5, which illustrates one exemplary implementation of the method described by FIG. 10. Specifically, with reference to block 104, the two components are contained inside a chamber 540 that is formed when the first and second substrates are bonded to one another.

With further reference to block 104 of FIG. 10, the first material is more compatible than the second material, to one or more aspects related to the component of the first type. For example, the first material is more compatible in terms of fabricating a passive component upon a surface of the substrate. Additionally, the first material provides better performance for example, due to reduced parasitic capacitance associated with the component of the first type. Conversely, the second material is more compatible than the first material, to one or more aspects related to the component of the second type. For example, the second material is more compatible for fabricating an active component, such as transistor 205. The second material may also provide better performance of the second component.

While the example above referred to fabricating a passive component on the first substrate and an active component on the second substrate, it will be understood that additional components, active and passive may also be fabricated in addition to, or in lieu of the exemplary components, upon one or both substrates.

The above-described embodiments of the present invention are merely set forth for a clear understanding of the principles of the invention. Many variations and modifications may be made without departing substantially from the invention. All such modifications and variations are included herein within the scope of this disclosure.

The invention claimed is:

1. An integrated circuit, comprising:
   a first substrate having a component of a first type fabricated thereon, the first substrate comprising a first material;
   a second substrate disposed opposite the first substrate, the second substrate having a component of a second type fabricated thereon, the second substrate comprising a second material; and
   an electrical connection between the components, in which:
   the first material has better compatibility with performance of components of the first type than the second material; and
   the second material has better compatibility with performance of components of the second type than the first material.

2. The integrated circuit of claim 1, in which:
   the component of the first type is a passive component; and
   the component of the second type is an active component.

3. The integrated circuit of claim 1, in which:
   the component of the first type is one of an active component and a passive component; and
   the component of the second type is an active component.

4. The integrated circuit of claim 1, additionally comprising a component of the second type fabricated on the first substrate.

5. An integrated circuit, comprising:
- a first substrate having a component of a first type fabricated thereon, the first substrate comprising a first material having a resistivity greater than or equal to 1 kohm-cm;
- a second substrate disposed opposite the first substrate, the second substrate having a component of a second type fabricated thereon, the second substrate comprising a second material; and
- an electrical connection between the components, in which:
- the first material has better compatibility with at least one of (a) fabrication and (b) performance of components of the first type than the second material; and
- the second material has better compatibility with at least one of (a) fabrication and (b) performance of components of the second type than the first material.

6. The integrated circuit of claim 5, in which the first material is silicon.

7. The integrated circuit of claim 5, in which the second material has a resistivity less than 100 ohm-cm.

8. The integrated circuit of claim 1, in which no component of the first type is fabricated on the second substrate.

9. The integrated circuit of claim 1, in which:
- the first substrate and the second substrate are bonded to one another to define a chamber; and
- the components are located in the chamber.

10. The integrated circuit of claim 1, in which the electrical connection comprises one of (a) a wire and (b) an electrically-conductive post extending between the substrates.

11. The integrated circuit of claim 9, additionally comprising a gasket disposed between the first substrate and the second substrate.

12. The integrated circuit of claim 11, in which the chamber is hermetic.

13. The integrated circuit of claim 1, in which the electrical connection comprises one of (a) a wire and (b) an electrically-conductive post.

14. The integrated circuit of claim 1, additionally comprising a via extending through at least one of the substrates.

* * * * *